United States Patent
Eguchi et al.

(10) Patent No.: US 8,289,773 B2
(45) Date of Patent: Oct. 16, 2012

(54) NON-VOLATILE MEMORY (NVM) ERASE OPERATION WITH BROWNOUT RECOVERY TECHNIQUE

(75) Inventors: Richard K. Eguchi, Austin, TX (US); Jon S. Choy, Austin, TX (US); Richard K. Glaeser, Lakeway, TX (US); Chen He, Austin, TX (US); Peter J. Kuhn, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 155 days.

(21) Appl. No.: 12/942,260

(22) Filed: Nov. 9, 2010

(65) Prior Publication Data
US 2012/0117307 A1    May 10, 2012

(51) Int. Cl.
*G11C 11/34* (2006.01)
(52) U.S. Cl. ......... 365/185.17; 365/185.18; 365/185.19; 365/185.22; 365/185.24; 365/185.29; 365/185.33
(58) Field of Classification Search ............. 365/185.17, 365/185.18, 185.19, 185.22, 185.24, 185.29, 365/185.33
See application file for complete search history.

(56) References Cited

U.S. PATENT DOCUMENTS

| | | | |
|---|---|---|---|
| 6,483,751 B2 * | 11/2002 | Chen et al. | 365/185.33 |
| 6,483,752 B2 * | 11/2002 | Hirano | 365/185.33 |
| 6,724,662 B2 * | 4/2004 | Manea | 365/185.19 |
| 6,836,435 B2 | 12/2004 | Li | |
| 6,967,873 B2 | 11/2005 | Hamilton et al. | |
| 7,061,811 B2 * | 6/2006 | Wooldridge | 365/185.22 |
| 7,180,781 B2 | 2/2007 | Abedifard et al. | |
| 7,301,812 B2 * | 11/2007 | Guterman et al. | 365/185.18 |
| 7,366,020 B2 * | 4/2008 | Choi | 365/185.18 |
| 7,411,827 B2 * | 8/2008 | Guterman et al. | 365/185.17 |
| 7,558,122 B2 | 7/2009 | Kim et al. | |
| 7,633,813 B2 * | 12/2009 | Wang et al. | 365/185.29 |
| 7,830,717 B2 * | 11/2010 | Won et al. | 365/185.17 |
| 7,852,683 B2 * | 12/2010 | Lutze et al. | 365/185.17 |
| 7,924,618 B2 * | 4/2011 | Lee | 365/185.18 |
| 8,036,035 B2 * | 10/2011 | Moschiano et al. | 365/185.29 |
| 8,072,802 B2 * | 12/2011 | Kikuchi et al. | 365/185.29 |
| 8,077,524 B2 * | 12/2011 | Lutze et al. | 365/185.24 |

FOREIGN PATENT DOCUMENTS

| WO | 02082447 A2 | 10/2002 |
|---|---|---|
| WO | 02095762 A2 | 11/2010 |

* cited by examiner

*Primary Examiner* — Trong Phan
(74) *Attorney, Agent, or Firm* — James L. Clingan, Jr.; Daniel D. Hill

(57) ABSTRACT

A method for erasing a non-volatile memory includes: performing a first pre-erase program step on the non-volatile memory; determining that the non-volatile memory failed to program correctly during the first pre-erase program step; performing a first soft program step on the non-volatile memory in response to determining that the non-volatile memory failed to program correctly; determining that the non-volatile memory soft programmed correctly; performing a second pre-erase program step on the non-volatile memory in response to determining that the non-volatile memory soft programmed correctly during the first soft program step; and performing an erase step on the non-volatile memory. The method may be performed using a non-volatile memory controller.

20 Claims, 2 Drawing Sheets

NON-VOLATILE MEMORY (NVM) ERASE OPERATION WITH BROWNOUT RECOVERY TECHNIQUE

BACKGROUND

1. Field

This disclosure relates generally to non-volatile memories (NVMs), and more specifically, to brownout recovery techniques for NVMs.

2. Related Art

An NVM commonly has program and erase cycles that to be effective need to be uninterrupted. On occasion, however, an interruption does occur. This is typically most likely to occur during an erase operation because erase operations are typically quite long because erase operations commonly include many steps such as pre-erase program, erase, and soft programming. This interruption is normally a result of a loss or reduction in power and thus called a brownout. The brownouts can occur at any point in the erase operation and information as to precisely what state that is may be impossible or at least difficult to store. Also, the cells have a distribution so the precise state of the cells is similarly difficult to know even if the precise point in the erase operation where the brownout has occurred is precisely known. Thus, brownout recovery generally is simply to repeat the erase operation from the beginning. Nonetheless, there are brownouts that result in a subsequent failure to erase, especially when some cells are left in the over-erased state as a result of the brownout.

Accordingly, it is desirable to provide a technique that provides a reduction in failures due to brownout.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM uses an erase operation that begins with a regular programming step to set the cells of the NVM in a known state, the programmed state. This is followed by an erase step that may result in some of the cells being over-erased and thus having high leakage. A soft programming step is then performed so that the over-erased cells have their threshold voltages increased to avoid causing excessive leakage. If the regular program step, at the first attempt, fails to achieve the desired result of all of the cells being in the known programmed state, the soft programming step is run again. After the soft programming step, the regular programming step is run. If this still results in a failure, then this is considered a failure to erase. If, on the other hand, the cells all pass the regular programming step, the erase step is then performed which typically results in some cells being over-erased. The soft programming step is then performed to increase the threshold voltage of the over-erased cells and complete the erase operation. This is better understood by reference to the following description and the drawings.

Figure 1:
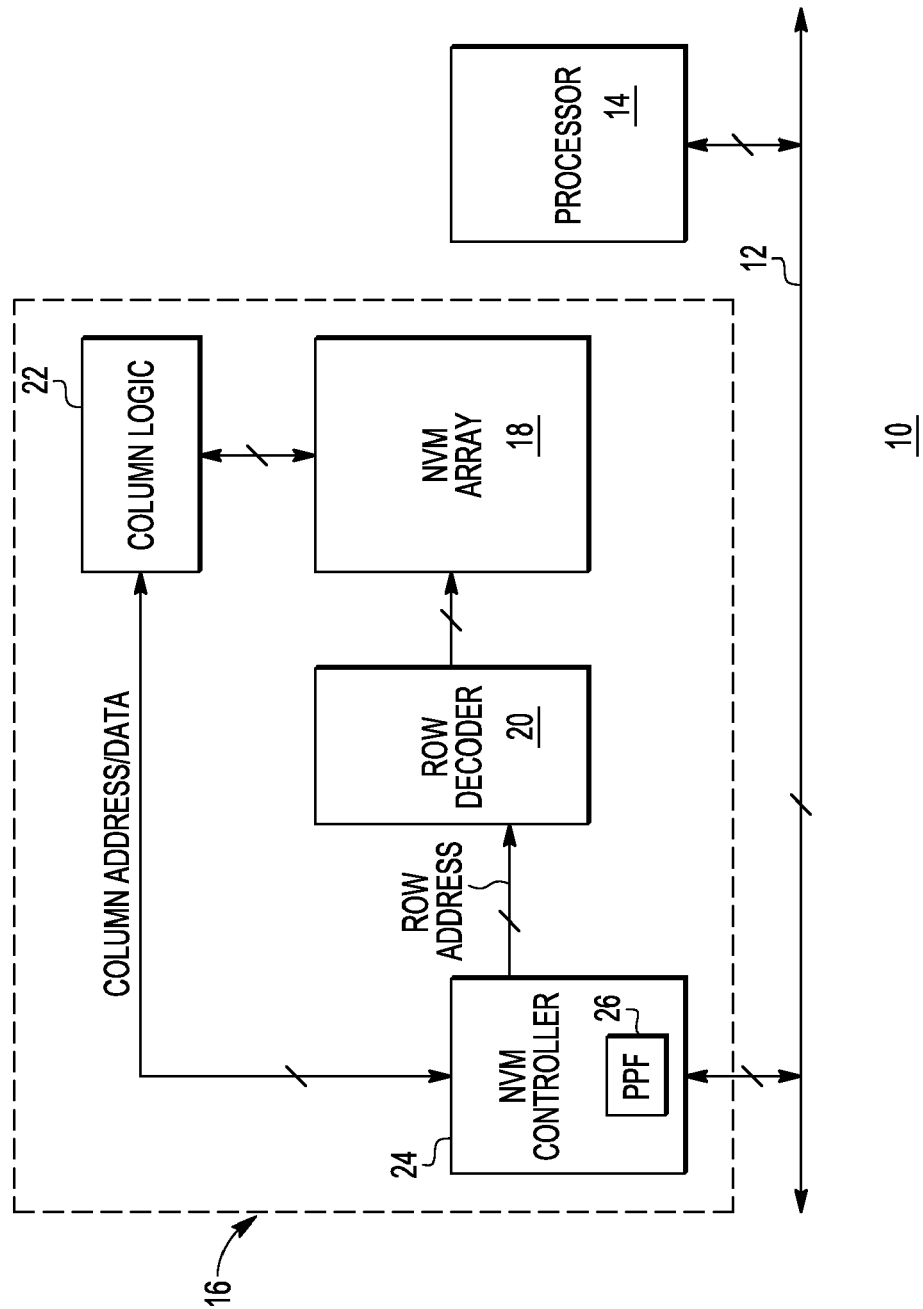
FIG. 1 is a diagram of a system having an NVM having an erase operation with brownout recovery support according to an embodiment.

Shown in FIG. 1 is a system 10 including a bus 12, a processor 14 coupled to bus 12, and a non-volatile memory (NVM) 16 coupled to bus 12. NVM 16 includes an NVM array 18, a row decoder 20 coupled to NVM array 18, column logic 22 coupled to NVM array 18, an NVM controller 24 coupled to bus 12, column logic 22, and row decoder 20. NVM controller 24 includes a pre program flag (PPF) bit 26. The inputs and outputs as shown in FIG. 1 are multi-bit. NVM controller 24 controls operation of NVM 18. NVM controller 24 controls the operation of NVM array 18 through row decoder 20 and column logic 22 in response to processor 14 as communicated through bus 12.

Figure 2:
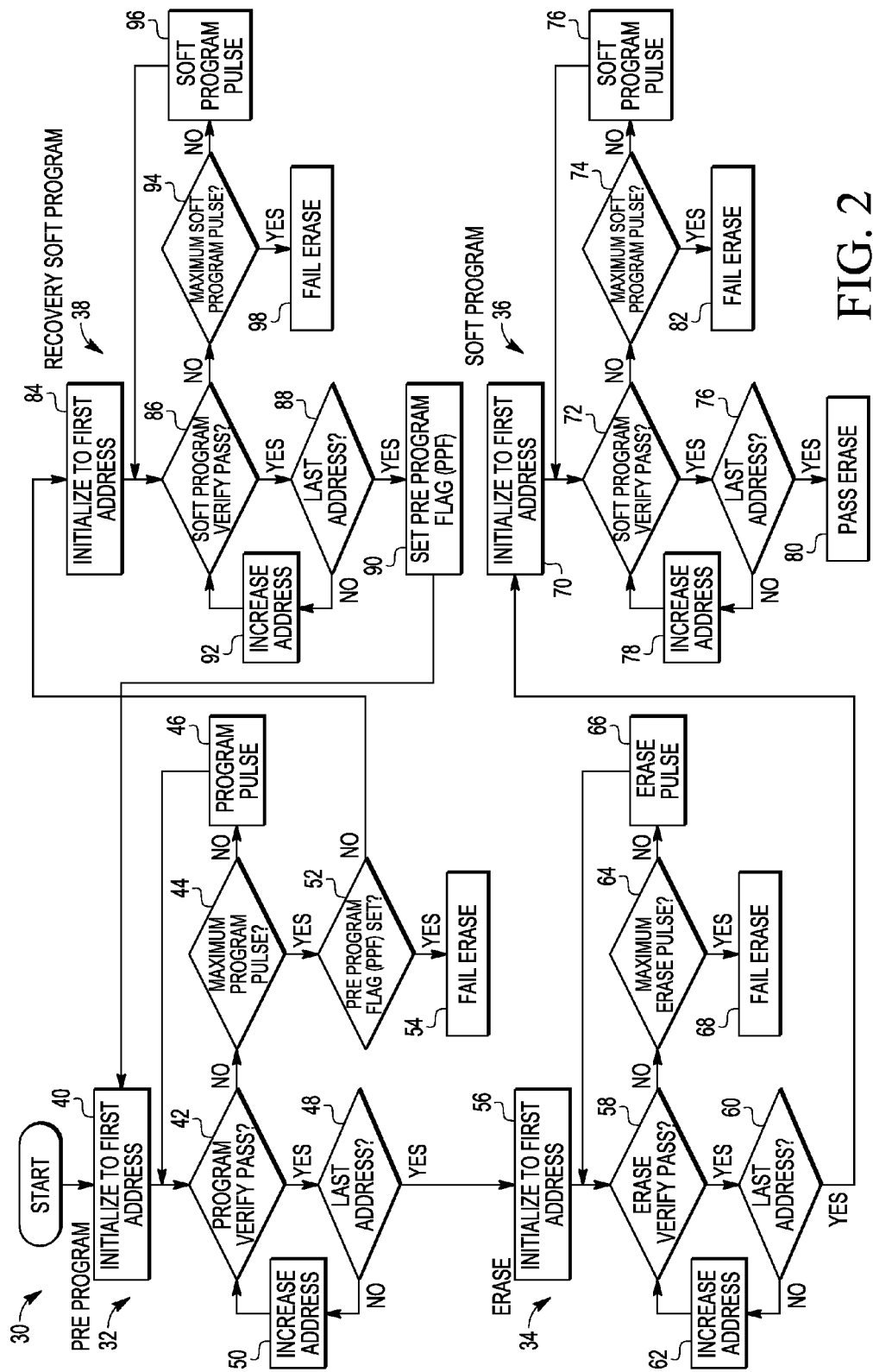
FIG. 2 is a flow chart showing a method of an erase operation with brownout recovery according to the embodiment that may be implemented in the system of FIG. 1.

Shown in FIG. 2 is a method 30 for providing an erase operation for memory cells of NVM 18. Prior to the erase operation, typically, the memory cells are divided into one of two categories, programmed and erased. In method 30 the first portion of the erase operation is a step of programming all of the memory cells that are not already programmed to the programmed state. This programming step is performed prior to the step that actually places the memory cells into the erased state and thus may be called a pre-erase program step. To shorten this term further and to how it is more commonly referenced, it may be called pre program and is shown as pre program 32. After successful pre programming, the erase step is performed and is shown as erase 34. After a successful erase, a soft program is performed to increase the threshold voltage of memory cells that have been over-erased and is shown as soft program 36. If pre-program 32 is not successful the first time, a recovery soft program 38 is performed so that the memory cells are in a condition where they can be successfully programmed. The recovery soft program 38 may be substantially the same operation as soft program 36. If pre program 32 is unsuccessful after running recovery soft program 38, then NVM array 18 is identified as a failure to erase.

Pre program 32 begins with initializing a first address in step 40. At step 42, the memory cell or memory cells at the first address are checked to verify they are at the programmed state. If the programmed state is not verified, then a determination at step 44 is made if the programming pulse applied to the memory cell or cells at that state was the maximum pulse count. If not, then a programming pulse at step 46, which may be stronger than the previously applied programming pulse, is applied to the memory cell or cells at the address. Verification of programming is again performed as shown at step 42. If it is verified, it is checked to see if it is for the last address at step 48. If it is, then pre program 32 is complete and erase 34 commences. If it is not for the last address, the address is incremented at step 50 to read the next memory cell or memory cells at the incremented address. Program verify 42 is again performed. The operation continues until the last address is reached and verified or an address has a memory cell or memory cells that fail to program which is identified at step 44 in which there has been a failure to pass programming by the maximum number of pulses. In such case, at step 52, there is a determination that a pre program flag (PPF) has or has not been set. If it has been set, then a fail to erase at step 54 is provided as an output. PPF may simply be a bit in a register of NVM controller 24. If it has not been set, then recovery soft program 38 is performed. PPF will be set after recovery soft program 38 has successfully run in the current erase operation.

When pre program 32 is successful, erase 34 begins at step 56 initializing a first address to verify at step 58 if the memory cell or cells at the first address have been erased. If yes and it is not the last address as determined at step 60, then the address is incremented at step 62. Erase is then verified at step 58 at the incremented address until erase has been verified for all of the addresses as detected at step 60. If at step 58, erase is not verified for an address, then, if the maximum number of erase pulses has not been applied as determined at step 64, another erase pulse is applied to the memory cells of NVM array 18 at step 66. This erase pulse may be stronger than the previously applied erase pulse. Two examples of stronger are longer time duration and higher voltage. After the erase pulse at step 66, erase verify is performed again at step 58. If at step 64 it is determined that the maximum pulse has already been applied, then a fail erase output is provided at step 68. When step 60 indicates that the last address has been verified as having been erased, soft program 36 commences.

Soft program 36 begins by initializing a first address at step 70 to discover at step 72 if there is overerasing (failing soft program verify) at that location. If so, a determination at step 74 is made if the maximum number of soft programming pulses has been applied and if not applying a soft programming pulse at step 76. The soft programming pulse may simply be a lower voltage applied to the control gates of the memory cells to be soft programmed as compared to a normal program pulse. The pulse conditions are selected so that the over-erased memory cells are slightly programmed to still be erased but not over-erased. This reduces current leakage between the drain and source. After application of the soft programming pulse at step 76, verification at step 72 is performed. This is to ensure that the memory cell or cells are not over-erased but are still with sufficiently low threshold voltage to be considered to be erased. If step 72 verifies that overerasure is not present for the current address, then there is a determination at step 76 if the last address has been reached. If not, the address is incremented at step 78. If so, an output at step 80 indicates that the erase operation was successful. If step 72 identifies that soft program verify fails and step 74 indicates that the maximum number of soft programming pulses has been applied, then at step 82, an output indicating that a failed erase operation has occurred is provided.

Recovery soft program 38 becomes significant when pre program 32 results in a failure to program at step 44 in the case where PPF has not been set which is the case where preprogram 32 had not previously been run for the current erase operation. In such case step 52 indicates that PPF has not been set. Recovery soft program 38 then begins with initializing the first address at step 84 for determining at step 86 if the memory cell or cells at that address are not over-erased. If verification is passing at step 86, step 88 determines if this is the last address. If yes, PPF is set at step 90. If no, the address is incremented at step 92, and verification at step 86 is performed for that incremented address. If the indication from step 86 is "no" indicating an over-erased condition, a determination is made at step 94 if the maximum number of soft programming pulses has been applied. If not, then a soft program pulse is applied at step 96. The software pulses may increase in strength each time step 96 is performed for a given address. If step 94 indicates that the maximum soft programming pulse has been applied, then at step 98 an output is provided indicating that the erase operation has failed. For the case where the PPF is set at step 90, pre program 32 is subsequently run again.

Recovery soft program 38 will typically be run as a consequence of a brownout in which some of the memory cells are over-erased during erase 34 and soft program 36 has not had time to correct that. This can occur when brownout occurs during erase 34 or soft program 36. When the erase operation is begun anew, a failure to erase occurs during pre program 32 due to the over-erased cells not programming. Pre program 32 uses relatively high gate voltage that creates a relatively high current for generating hot carriers. It would appear that a higher gate voltage would more likely to be successful in programming, but the inventors have discovered that if the current becomes too high which occurs in the case of over-erased memory cells, the hot carriers are not sufficiently energetic to reach an overlying floating gate and thus programming does not occur. By first soft programming using a weaker programming pulse and a lower verify level, the memory cells are brought to at least a condition where the programming current is not excessive and the cells that were over-erased can be programmed. The primary reason for the current being excessive is that it pulls down the supply voltage on the drain. The supply voltage on the drain is generally generated by charge pumps because it generally needs to be higher than the power supply for the general logic. Thus, without having to provide an otherwise unnecessarily expensive charge pump, the over-erased memory cells can be successfully programmed by first soft programming them.

After recovery soft program 38 has been successfully run, pre program 32 is run with all of the memory cells out of the over-erased condition. Of course, even after a successfully running recovery soft program 38, there is no certainty that pre program 32 will be successful because, for example, the affect of a latent defect may manifest itself at any time. If after the maximum program pulse has been applied and step 42 fails to verify that programming has occurred, and PPF at step 52 has been set, step 54 provides the fail to erase output.

By now it should be appreciated that there has been provided a method for erasing a non-volatile memory. The method includes performing a first pre-erase program step on the non-volatile memory. The method further includes determining that the non-volatile memory failed to program correctly during the first pre-erase program step. The method further includes performing a first soft program step on the non-volatile memory in response to determining that the non-volatile memory failed to program correctly. The method further includes determining that the non-volatile memory soft programmed correctly. The method further includes performing a second pre-erase program step on the non-volatile memory in response to determining that the non-volatile memory soft programmed correctly during the first soft program step. The method further includes performing an erase step on the non-volatile memory. The method may have a further characterization by which performing the first pre-erase program step further comprises determining that performing the first pre-erase program step is a first attempt at performing the first pre-erase program step. The method may have a further characterization by which determining that the non-volatile memory failed to program correctly further comprises determining that the non-volatile memory failed to program correctly during a first attempt of the first pre-erase program step. The method may have a further characterization by which performing the first soft program step further comprises setting a bit in a non-volatile memory controller when the first soft program step is successful. The method may have a further characterization by which performing the first soft programming step further comprises compacting a threshold voltage distribution of the non-volatile memory to a predetermined voltage range. The method may have a further characterization by which performing a second soft program step on the non-volatile memory after performing the erase step on the non-volatile memory. The method may have a further characterization by which performing the first pre-erase program step further comprises applying a programming pulse having a first voltage to a control gate of a memory cell of the non-volatile memory. The method may have a further characterization by which the first soft programming step further comprises applying a soft programming pulse having a second voltage to the control gate of the memory cell, wherein the second voltage is lower than the first voltage.

Disclosed also is a method for erasing a non-volatile memory. The method includes performing a first pre-erase program step on the non-volatile memory. The method further includes determining that the non-volatile memory failed to program correctly during a first attempt of the first pre-erase program step. The method further includes performing a first soft program step on the non-volatile memory in response to determining that the non-volatile memory failed to program correctly during the first attempt of the pre-erase program step. The method further includes determining that the non-volatile memory soft programmed correctly. The method further includes performing a second pre-erase program step on the non-volatile memory in response to determining that the non-volatile memory soft programmed correctly during the first soft program step. The method further includes performing an erase step on the non-volatile memory. The method further includes performing a second soft program step on the non-volatile memory after performing the erase step. The method may have a further characterization by which performing a first soft program step further comprises setting a bit in a non-volatile memory controller when the first soft program step is successful. The method may have a further characterization by which performing the first pre-erase program step further comprises applying a programming pulse having a first voltage to a control gate of a memory cell of the non-volatile memory. The method may have a further characterization by which performing the first soft programming step further comprises applying a soft programming pulse having a second voltage to the control gate of the memory cell, wherein the second voltage is lower than the first voltage. The method may have a further characterization by which the method for erasing the non-volatile memory further comprises erasing a NOR type flash memory.

Also disclosed is a non-volatile memory. The non-volatile memory comprises a plurality of non-volatile memory cells. The non-volatile memory further comprises a non-volatile memory controller, coupled to the plurality of non-volatile memory cells, the non-volatile memory controller for controlling an erase operation of the plurality of non-volatile memory cells, the erase operation comprising a first pre-erase program step, a first soft program step, a second pre-erase program step, and an erase step, wherein the first soft program step is performed in response to a failed first pre-erase program step, wherein the second pre-erase program step is performed in response to a successful first soft program step, and wherein the erase step is performed after either a successful first pre-erase program step or a successful second pre-erase program step. The non-volatile memory may have a further characterization by which the non-volatile memory is characterized as being a NOR type flash memory. The non-volatile memory may have a further characterization by which the non-volatile memory controller further comprises a bit field for storing an indication of a successful first soft program step. The non-volatile memory may have a further characterization by which the bit field is a portion of a register file in the non-volatile memory controller. The non-volatile memory may have a further characterization by which the non-volatile memory controller provides a first voltage to a control gate of each of the plurality of non-volatile memory cells during the first pre-erase program step. The non-volatile memory may have a further characterization by which the non-volatile memory controller provides a second voltage to the control gate of each of the plurality of non-volatile memory cells during the first soft program step, wherein the second voltage is less than the first voltage. The non-volatile memory may have a further characterization by which erase operation of the non-volatile memory further comprises a second soft program step, the second soft program step following the erase step.

Although the invention is described herein with reference to specific embodiments, various modifications and changes can be made without departing from the scope of the present invention as set forth in the claims below. For example, the operation was described of N channel NVM memory cells, but other types of memory cells may be found to be effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for erasing a non-volatile memory, the method comprising:
    performing a first pre-erase program step on the non-volatile memory;
    determining that the non-volatile memory failed to program correctly during the first pre-erase program step;
    performing a first soft program step on the non-volatile memory in response to determining that the non-volatile memory failed to program correctly;
    determining that the non-volatile memory soft programmed correctly;
    performing a second pre-erase program step on the non-volatile memory in response to determining that the non-volatile memory soft programmed correctly during the first soft program step; and
    performing an erase step on the non-volatile memory.

2. The method of claim 1, wherein performing the first pre-erase program step further comprises determining that performing the first pre-erase program step is a first attempt at performing the first pre-erase program step.

3. The method of claim 1, wherein determining that the non-volatile memory failed to program correctly further comprises determining that the non-volatile memory failed to program correctly during a first attempt of the first pre-erase program step.

4. The method of claim 1, wherein performing the first soft program step further comprises setting a bit in a non-volatile memory controller when the first soft program step is successful.

5. The method of claim 1, wherein performing the first soft programming step further comprises compacting a threshold voltage distribution of the non-volatile memory to a predetermined voltage range.

6. The method of claim 1, further comprising performing a second soft program step on the non-volatile memory after performing the erase step on the non-volatile memory.

7. The method of claim 1, wherein performing the first pre-erase program step further comprises applying a programming pulse having a first voltage to a control gate of a memory cell of the non-volatile memory.

8. The method of claim 7, wherein performing the first soft programming step further comprises applying a soft programming pulse having a second voltage to the control gate of the memory cell, wherein the second voltage is lower than the first voltage.

9. A method for erasing a non-volatile memory, the method comprising:
   performing a first pre-erase program step on the non-volatile memory;
   determining that the non-volatile memory failed to program correctly during a first attempt of the first pre-erase program step;
   performing a first soft program step on the non-volatile memory in response to determining that the non-volatile memory failed to program correctly during the first attempt of the pre-erase program step;
   determining that the non-volatile memory soft programmed correctly;
   performing a second pre-erase program step on the non-volatile memory in response to determining that the non-volatile memory soft programmed correctly during the first soft program step;
   performing an erase step on the non-volatile memory; and
   performing a second soft program step on the non-volatile memory after performing the erase step.

10. The method of claim 9, wherein performing a first soft program step further comprises setting a bit in a non-volatile memory controller when the first soft program step is successful.

11. The method of claim 9, wherein performing the first pre-erase program step further comprises applying a programming pulse having a first voltage to a control gate of a memory cell of the non-volatile memory.

12. The method of claim 11, wherein performing the first soft programming step further comprises applying a soft programming pulse having a second voltage to the control gate of the memory cell, wherein the second voltage is lower than the first voltage.

13. The method of claim 9, wherein the method for erasing the non-volatile memory further comprises erasing a NOR type flash memory.

14. A non-volatile memory comprising:
   a plurality of non-volatile memory cells; and
   a non-volatile memory controller, coupled to the plurality of non-volatile memory cells, the non-volatile memory controller for controlling an erase operation of the plurality of non-volatile memory cells, the erase operation comprising a first pre-erase program step, a first soft program step, a second pre-erase program step, and an erase step, wherein the first soft program step is performed in response to a failed first pre-erase program step, wherein the second pre-erase program step is performed in response to a successful first soft program step, and wherein the erase step is performed after either a successful first pre-erase program step or a successful second pre-erase program step.

15. The non-volatile memory of claim 14, wherein the non-volatile memory is characterized as being a NOR type flash memory.

16. The non-volatile memory of claim 14, wherein the non-volatile memory controller further comprises a bit field for storing an indication of a successful first soft program step.

17. The non-volatile memory of claim 16, wherein the bit field is a portion of a register file in the non-volatile memory controller.

18. The non-volatile memory of claim 14, wherein the non-volatile memory controller provides a first voltage to a control gate of each of the plurality of non-volatile memory cells during the first pre-erase program step.

19. The non-volatile memory of claim 18, wherein the non-volatile memory controller provides a second voltage to the control gate of each of the plurality of non-volatile memory cells during the first soft program step, wherein the second voltage is less than the first voltage.

20. The non-volatile memory of claim 14, wherein the erase operation of the non-volatile memory further comprises a second soft program step, the second soft program step following the erase step.

* * * * *